United States Patent
Yamaguchi et al.

(10) Patent No.: US 9,468,121 B2
(45) Date of Patent: Oct. 11, 2016

(54) ELECTRICAL CONNECTION BOX

(71) Applicant: YAZAKI CORPORATION, Tokyo (JP)

(72) Inventors: Syota Yamaguchi, Shizuoka (JP); Teppei Doi, Shizuoka (JP); Joh Fujimoto, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 14/950,507

(22) Filed: Nov. 24, 2015

(65) Prior Publication Data
US 2016/0156162 A1    Jun. 2, 2016

(30) Foreign Application Priority Data
Nov. 28, 2014 (JP) ................... 2014-241426

(51) Int. Cl.
| H05K 5/00 | (2006.01) |
| H05K 7/02 | (2006.01) |
| H01R 9/22 | (2006.01) |
| B60R 16/023 | (2006.01) |

(52) U.S. Cl.
CPC ............ *H05K 7/02* (2013.01); *B60R 16/0238* (2013.01); *H01R 9/226* (2013.01)

(58) Field of Classification Search
CPC ...... H05K 1/0203; H05K 7/026; H05K 7/02; H02B 1/18; H02B 1/20; B60R 16/0238; B60R 16/027; H01R 13/6608; H01R 12/724
See application file for complete search history.

(56) References Cited

U.S. PATENT DOCUMENTS

| 4,695,106 A * | 9/1987 | Feldman | H01R 12/714 439/108 |
| 2002/0124994 A1* | 9/2002 | Tanaka | B60R 16/0239 165/80.2 |
| 2004/0007379 A1* | 1/2004 | Suzuki | B60R 16/0239 174/59 |
| 2004/0109296 A1* | 6/2004 | Nakayama | H01R 9/223 361/752 |
| 2008/0247133 A1 | 10/2008 | Ito | |
| 2010/0202120 A1* | 8/2010 | Kita | H05K 7/026 361/752 |
| 2011/0299229 A1* | 12/2011 | De La Reza | B60R 16/0238 361/624 |
| 2013/0044447 A1* | 2/2013 | Shiozaki | H05K 1/0203 361/752 |

FOREIGN PATENT DOCUMENTS

JP    2008-182797 A    8/2008

* cited by examiner

*Primary Examiner* — Steven T Sawyer
(74) *Attorney, Agent, or Firm* — Sughrue Mion, PLLC

(57) ABSTRACT

An electrical connection box includes FL accommodating parts that are disposed on a main face wall of a casing that faces a front side of a circuit board and to which fusible links are fit; first bus bars that are erected in a vertical direction from the circuit board and connect the fusible links fit to the FL accommodating parts and the circuit board; second bus bars each of which includes a first vertical part erected in the vertical direction from the circuit board, a horizontal part that extends in a parallel direction with respect to the circuit board, and a second vertical part that extends in the vertical direction and that connect the fusible links and the circuit board; and a block body of a bus bar block that is disposed on the circuit board and holds the first bus bars and the second bus bars.

5 Claims, 7 Drawing Sheets

ELECTRICAL CONNECTION BOX

CROSS-REFERENCE TO RELATED APPLICATIONS

The present application claims priority to and incorporates by reference the entire contents of Japanese Patent Application No. 2014-241426 filed in Japan on Nov. 28, 2014.

BACKGROUND OF THE INVENTION

1. Field of the Invention

The present invention relates to an electrical connection box.

2. Description of the Related Art

An electrical connection box such as a junction box mounted on vehicles such as automobiles has conventionally been known that accommodates a circuit board thereinside, includes electronic component accommodating parts to which electronic components are fit on an outer face of a casing that faces a front face of the circuit board, and connects the electronic components fit to the electronic component accommodating parts and the circuit board with bus bars (Japanese Patent Application Laid-open No. 2008-182797, for example).

In the electrical connection box disclosed in Japanese Patent Application Laid-open No. 2008-182797, when the electronic components are inserted into and fit to the electronic component accommodating parts on the casing, through a pressing force (an inserting force) applied to the bus bars to be connected to the electronic components, the bus bars may bend and considerably deform. Solder jointing is generally used for connection between the bus bars and the circuit board, and it is desirable that the deformation of the bus bars through an external force be prevented and that favorable connection between the bus bars and the circuit board be ensured.

SUMMARY OF THE INVENTION

The present invention is made in consideration of the above, and an object of the present invention is to provide an electrical connection box favorably capable of preventing deformation of bus bars to be connected to electronic components when the electronic components are fit.

In order to achieve the above mentioned object, an electrical connection box according to one aspect of the present invention includes a casing; a circuit board accommodated within the casing; electronic component accommodating parts that are disposed on an outer face of the casing that faces a front side of the circuit board and to which electronic components are fit; first bus bars that are erected in a vertical direction from the circuit board and configured to connect the electronic components fit to the electronic component accommodating parts and the circuit board; second bus bars each of which includes a first vertical part erected in the vertical direction from the circuit board, a horizontal part that is bent from the first vertical part and extends in a parallel direction with respect to the circuit board, and a second vertical part that is bent from the horizontal part and extends in the vertical direction, and that connect the electronic components fit to the electronic component accommodating parts and the circuit board; and a holding member that is disposed on the circuit board and configured to hold the first bus bars and the second bus bars.

According to another aspect of the present invention, in the electrical connection box, it is preferable that the holding member holds the first bus bars pressed in thereto and receives an inserting force applied to the horizontal parts of the second bus bars when the electronic components are inserted into the electronic component accommodating parts from the circuit board side to hold the second bus bars.

According to still another aspect of the present invention, in the electrical connection box, it is preferable to further include second electronic component accommodating parts that are disposed on a side face of the casing disposed orthogonally to the circuit board and to which second electronic components are fit; and third bus bars and fourth bus bars that connect the second electronic components fit to the second electronic component accommodating parts and the circuit board, wherein the holding member holds the third bus bars and the fourth bus bars.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
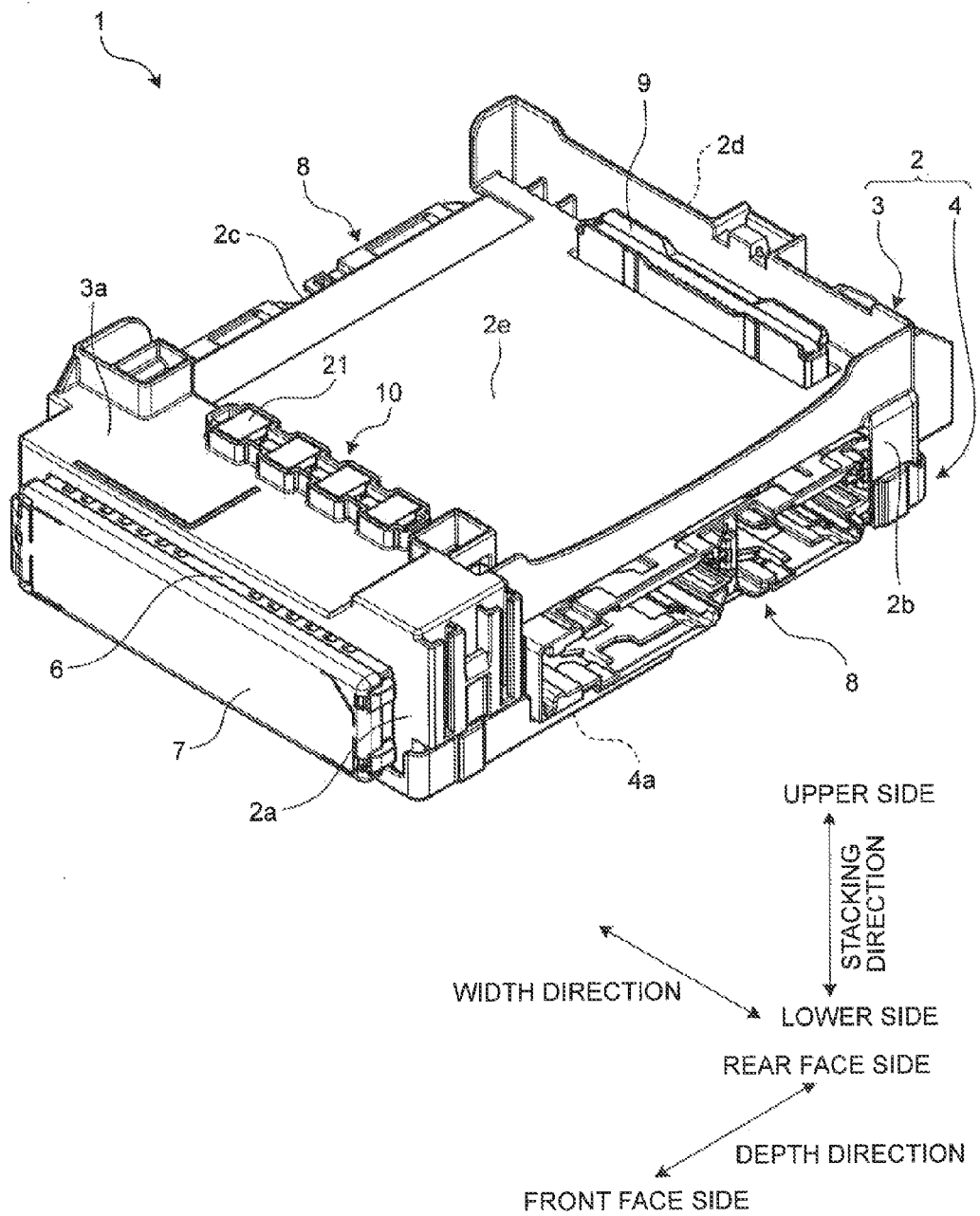
FIG. 1 is a perspective view illustrating a schematic configuration of an electrical connection box according to an embodiment of the present invention.

The following describes an embodiment of an electrical connection box according to the present invention based on the drawings. In the following drawings, the same or corresponding parts will be attached with the same reference numerals, and descriptions thereof will not be repeated.

Embodiment

Figure 2:
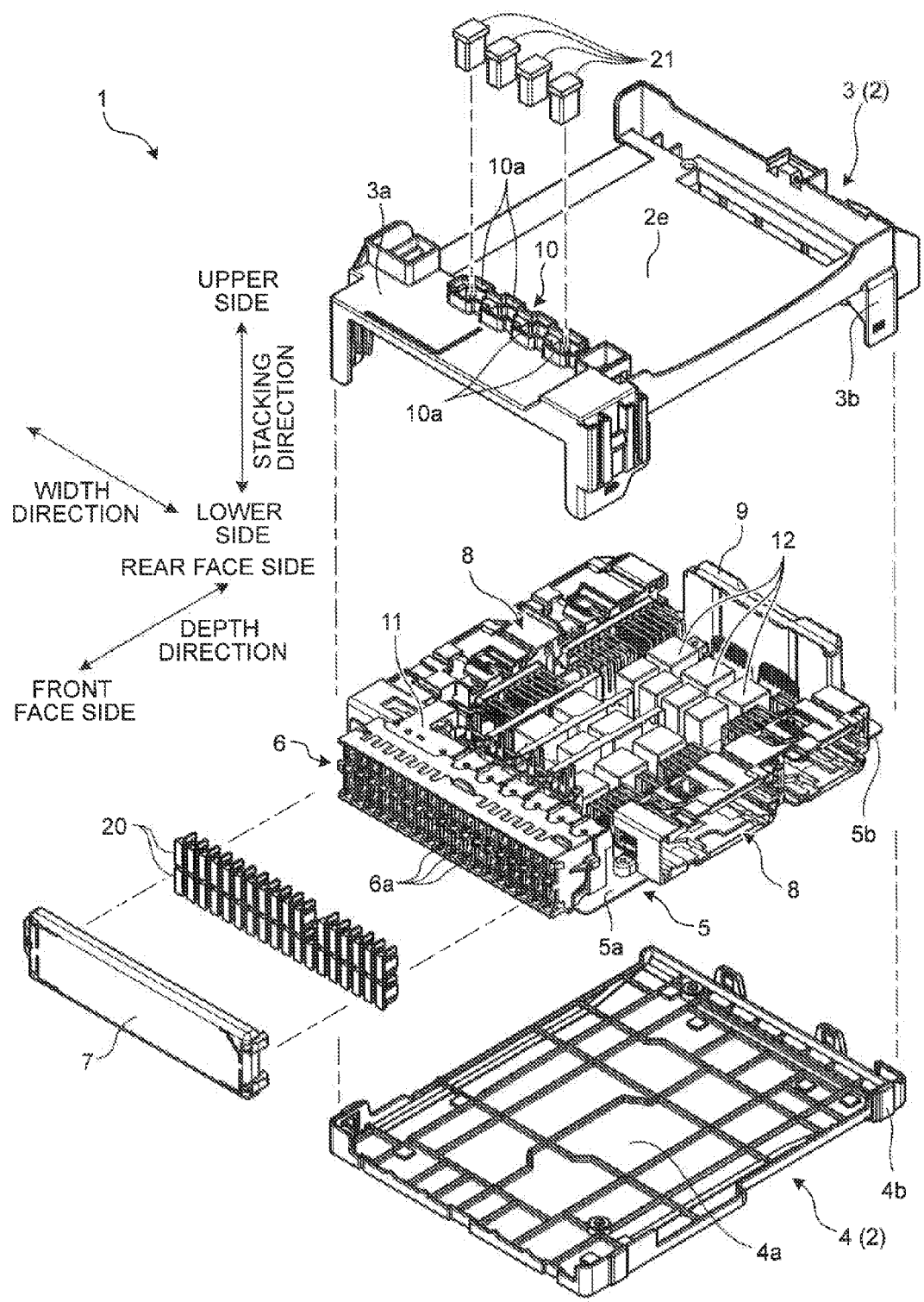
FIG. 2 is an exploded perspective view of the electrical connection box illustrated in FIG. 1.
Figure 3:
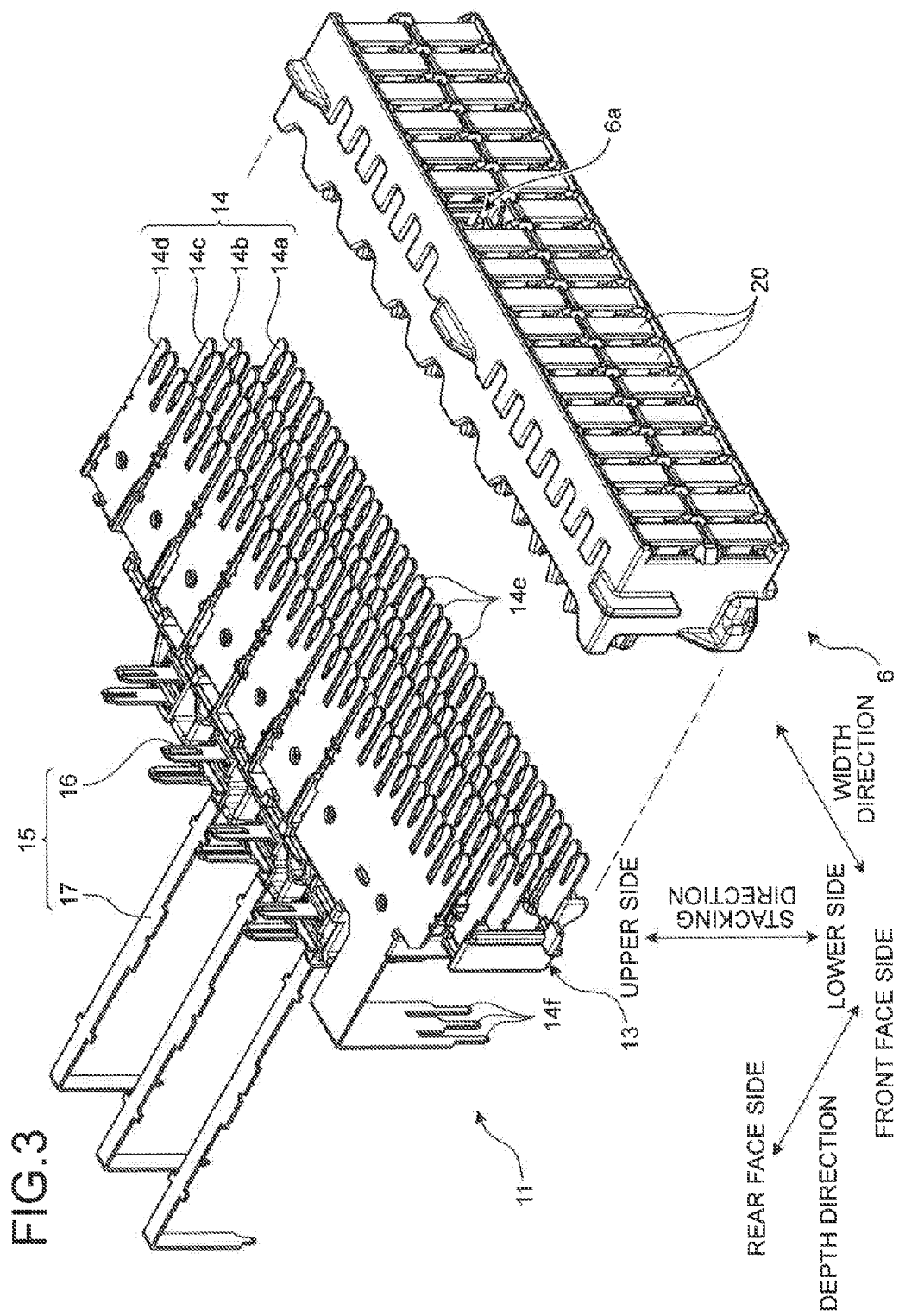
FIG. 3 is a perspective view of a bus bar block and a fuse holder in FIG. 2 on an enlarged scale.
Figure 4:
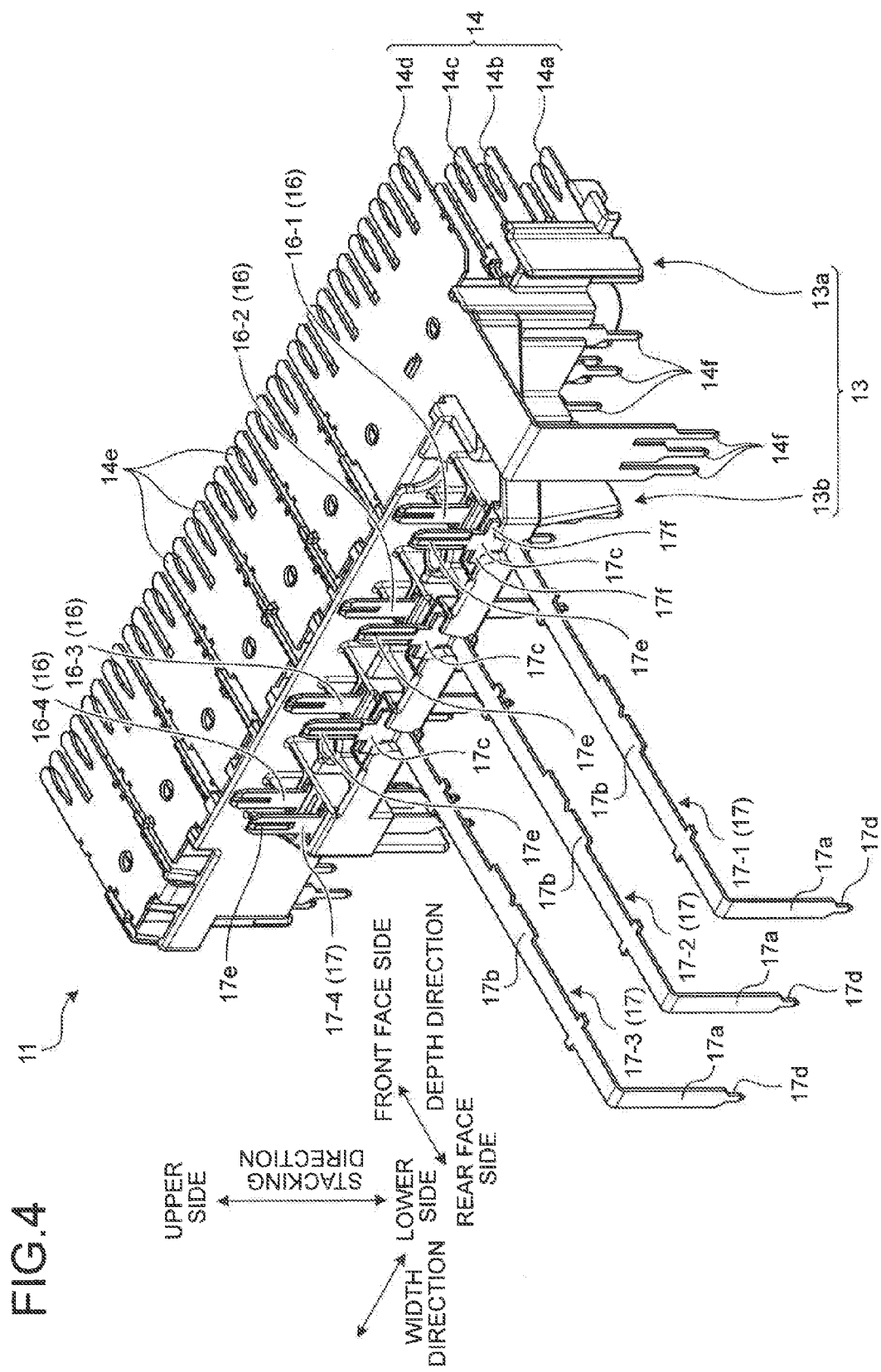
FIG. 4 is a perspective view of the bus bar block in FIG. 3 viewed from a rear face side in a depth direction.
Figure 5:
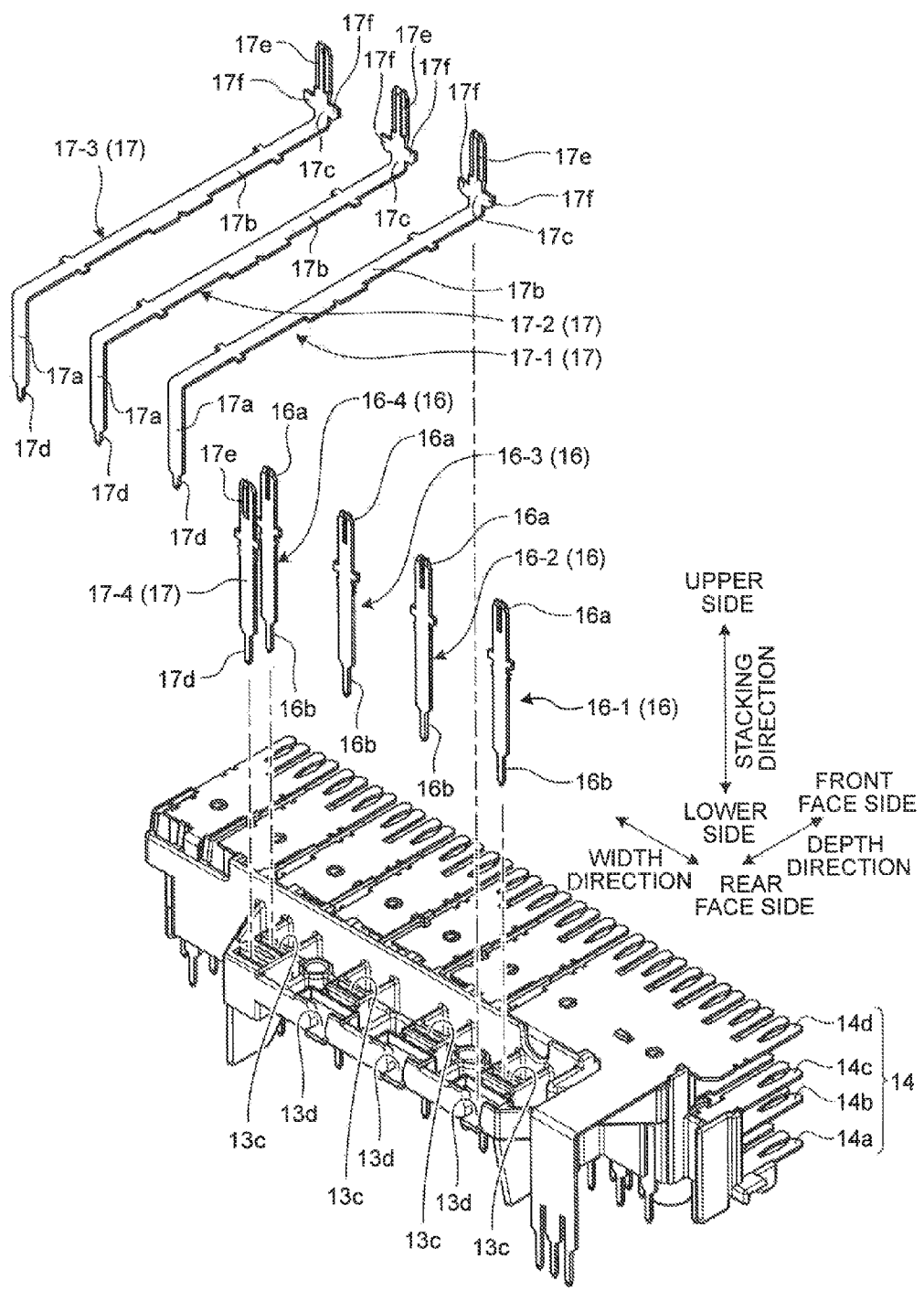
FIG. 5 is an exploded perspective view of the bus bar block illustrated in FIG. 4.
Figure 6:
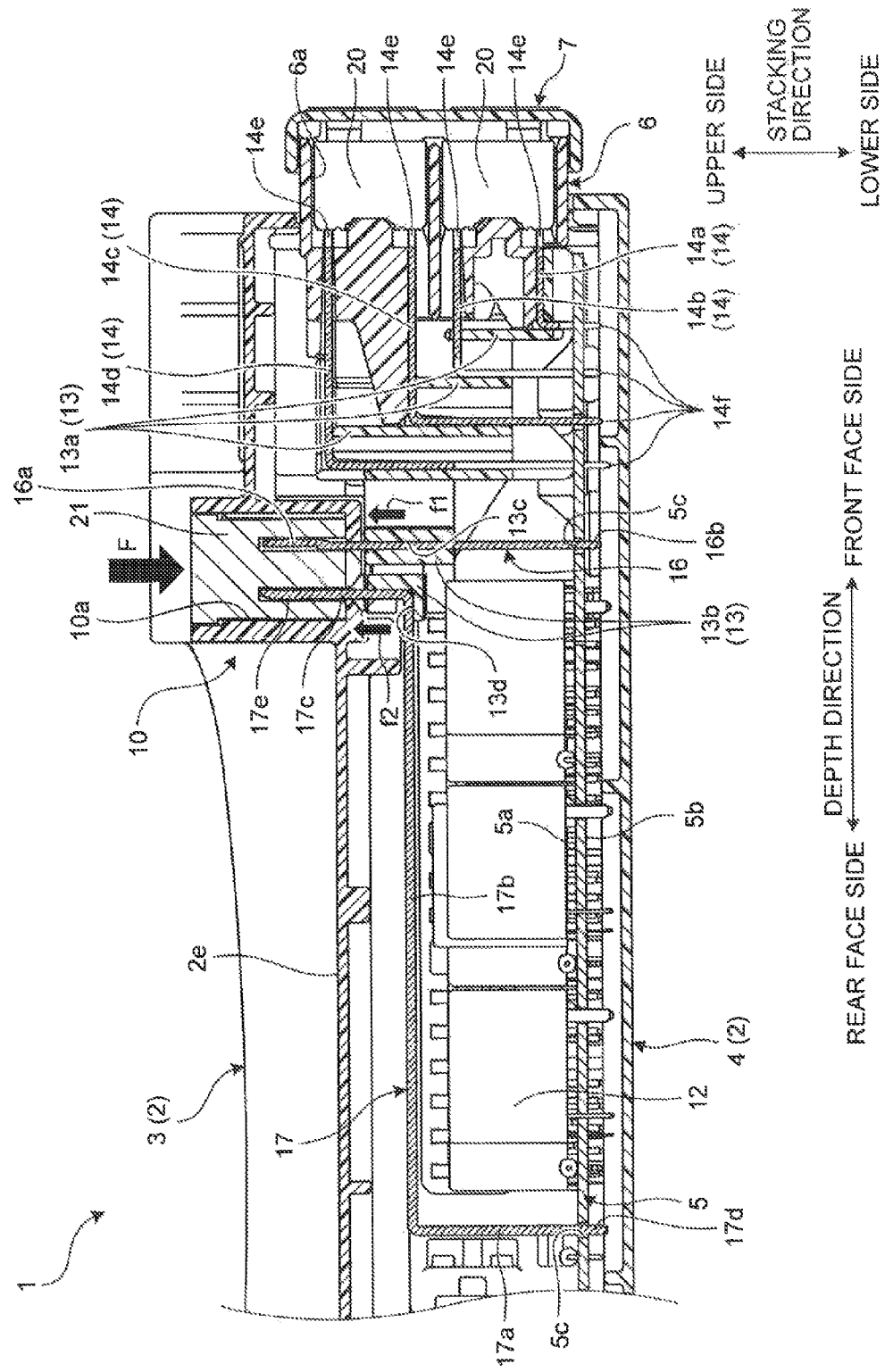
FIG. 6 is a sectional view in the depth direction of the electrical connection box illustrated in FIG. 1, illustrating a connection state of input side FL bus bars and output side FL bus bars, and fusible links and a circuit board.
Figure 7:
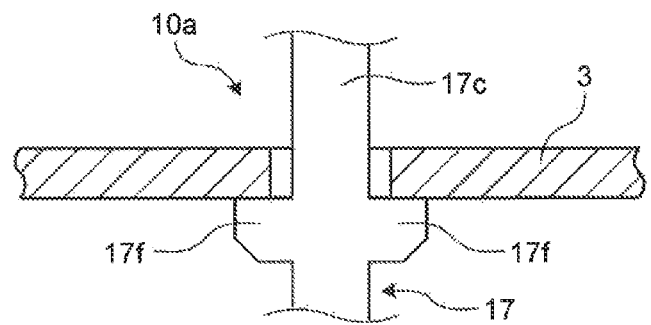
FIG. 7 is a schematic diagram of a contact part between an inner cover and an output side FL bus bar in a state in which the electrical connection box is assembled on an enlarged scale.

The following describes a configuration of an electrical connection box 1 according to an embodiment of the present invention with reference to FIGS. 1 through 7. FIG. 1 is a perspective view illustrating a schematic configuration of an electrical connection box according to an embodiment of the present invention. FIG. 2 is an exploded perspective view of the electrical connection box illustrated in FIG. 1. FIG. 3 is a perspective view of a bus bar block and a fuse holder in FIG. 2 on an enlarged scale. FIG. 4 is a perspective view of the bus bar block in FIG. 3 viewed from a rear face side in a depth direction. FIG. 5 is an exploded perspective view of the bus bar block illustrated in FIG. 4. FIG. 6 is a sectional view in the depth direction of the electrical connection box illustrated in FIG. 1, illustrating a connection state of input side FL bus bars and output side FL bus bars, and fusible links and a circuit board. FIG. 7 is a schematic diagram of a contact part between an inner cover and an output side FL bus bar in a state in which the electrical connection box is assembled on an enlarged scale.

In the following description, the up-and-down direction in FIGS. 1 and 2, that is, a direction in which an inner cover 3, a circuit board 5, and an outer cover 4 are stacked with each other as illustrated in FIG. 2 is expressed as a "stacking direction," and based on the circuit board 5, an inner cover 3 side is expressed as an "upper side," and an outer cover 4 side is expressed as a "lower side." The "upper side" and the "lower side" used in the description are not necessarily required to be the upper side and the lower side in the vertical direction. A direction in which connector blocks 8 face each other as a pair, that is, a facing direction of side walls 2b and 2c of a casing 2 is expressed as a "width direction." A direction that is orthogonal to both the stacking direction and the width direction, that is, a facing direction of side walls 2a and 2d of the casing 2 is expressed as a "depth direction." A side wall 2a side of the casing 2 is expressed as a "front face side," and a side wall 2d side thereof is expressed as a "rear face side."

The electrical connection box 1 according to the present embodiment illustrated in FIG. 1 is mounted on vehicles such as automobiles and collectively accommodates connectors constituting connection processing components such as wire harnesses and electric wires, fuses, relays, branch parts, and electric and electronic components such as electronic control units. The electrical connection box 1 is installed in an engine room of a vehicle or a lower part of a vehicle body and is connected to between a power supply such as a battery and various kinds of electronic devices installed in the vehicle, for example. The electrical connection box 1 distributes electric power supplied from the power supply to the various kinds of electronic devices in the vehicle. Although the electrical connection box 1 may also be called a junction box, a fuse box, a relay box, or the like, they are collectively called an electrical connection box in the present embodiment.

As illustrated in FIGS. 1 and 2, the electrical connection box 1 accommodates the circuit board 5 inside the casing 2. The casing 2 includes the inner cover 3 that supports the circuit board 5 from a front face 5a side and the outer cover 4 that supports the circuit board 5 from a back face 5b side opposite the inner cover 3. The inner cover 3 and the outer cover 4 are formed of an insulting synthetic resin. As illustrated in FIG. 2, the inner cover 3 has a substantially rectangular shape similar to the circuit board 5 and includes a main face wall 3a (an outer face) facing the circuit board 5 with the circuit board 5 accommodated inside the casing 2, and a peripheral wall 3b erected in the vertical direction along the perimeter of the main face wall 3a. The outer cover 4, similarly to the inner cover 3, has a substantially rectangular shape similar to the circuit board 5 and includes a main face wall 4a facing the circuit board 5 with the circuit board 5 accommodated inside the casing 2, and a peripheral wall 4b erected in the vertical direction along the perimeter of the main face wall 4a. The inner cover 3 and the outer cover 4 are fit to each other through the peripheral walls 3b and 4b, thereby forming the casing 2 having a substantially rectangular parallelepipedal shape illustrated in FIG. 1. In the present embodiment, both the main face walls 3a and 4a have a substantially rectangular shape, and as illustrated in FIG. 1, the casing 2 includes the main face walls 3a and 4a facing each other and four side walls 2a to 2d formed in between the main face walls 3a and 4a, and the walls form six outer surfaces. In other words, the casing 2 includes the main face wall 3a on the upper side in the stacking direction, the main face wall 4a on the lower side in the stacking direction, the side wall 2a on the front face side in the depth direction, the side wall 2d on the rear face side in the depth direction, and the side walls 2b and 2c on both sides in the width direction.

As illustrated in FIG. 1, in the electrical connection box 1, an opening is formed in part of one side wall 2a (a side wall) among the four side walls 2a to 2d of the casing 2, and a fuse holder 6 installed on the circuit board 5 accommodated inside the casing 2 is provided so as to be exposed to the outside. With this configuration, the fuse holder 6 enables fuses 20 (second electronic components) to be fit to fuse accommodating parts 6a (second electronic component accommodating parts) of the fuse holder 6 from the outside of the casing 2 with the electrical connection box 1 assembled. The fuse holder 6 includes a plurality of fuse accommodating parts 6a including two rows in the stacking direction, each row including a plurality of (18 in each row in the present embodiment) ones in the width direction. Each of the fuse accommodating parts 6a is a vertically oriented quadrangular through hole to which a fuse 20 is pressed in in the depth direction from the front face side in the depth direction, thereby supporting the fuse 20. As illustrated in FIGS. 2 and 3, the fuse holder 6 is coupled to a bus bar block 11 and is installed on the circuit board 5 via the bus bar block 11. The fuse holder 6 enables the fuse accommodating parts 6a to be blocked by fitting a lid 7 from the outside.

As illustrated in FIG. 1, in the electrical connection box 1, openings are formed also in part of the pair of side walls 2b and 2c that are both adjacent to the side wall 2a and face each other among the four side walls 2a to 2d of the casing 2, and a pair of connector blocks 8 installed on the circuit board 5 accommodated inside the casing 2 are provided so as to be exposed to the outside from the side walls 2b and 2c. With this configuration, various kinds of connectors (not illustrated) can be fit to the pair of connector blocks 8 from the outside of the casing 2 with the electrical connection box 1 assembled.

As illustrated in FIG. 1, the electrical connection box 1 includes an ECU installing face 2e that installs an electronic control unit (ECU) on the upper face of the main face wall 3a of the casing 2 and an ECU connector 9 for ECU connection. As illustrated in FIG. 2, the ECU connector 9 is connected to the end on the rear face side in the depth direction of the circuit board 5 and is provided so as to be exposed to the outside from the ECU installing face 2e of the casing 2 with the electrical connection box 1 assembled. The ECU installed on the ECU installing face 2e is connected to the ECU connector 9 and is electrically connected to the circuit board 5 via the ECU connector 9.

As illustrated in FIGS. 1 and 2, in the electrical connection box 1, a fusible link (FL) holder 10 is formed on the upper face of the main face wall 3a of the casing 2, that is, the outer face of the casing 2 that faces the front face 5*a* of the circuit board 5. The FL holder 10 includes a plurality of (four in the example in FIGS. 1 and 2) FL accommodating parts 10*a* (electronic component accommodating parts), into which fusible links 21 (electronic components) are pressed in in the stacking direction from the upper side in the stacking direction, that is, in a direction orthogonal to the circuit board 5, thereby enabling the fusible links 21 to be fit to the respective FL accommodating parts 10*a*.

As illustrated in FIG. 2, the circuit board 5 accommodated inside the casing 2 connects the bus bar block 11 disposed on the end on the front face side in the depth direction, the pair of connector blocks 8 disposed on both ends in the width direction, the ECU connector 9 disposed on the end on the rear face side in the depth direction, and a plurality of relays 12 disposed at a substantially central part surrounded by the bus bar block 11, the pair of connector blocks 8, and the ECU connector 9 to the front face 5*a*. The bus bar block 11, the pair of connector blocks 8, the ECU connector 9, and the relays 12 are appropriately electrically connected through a printed circuit formed on the back face 5*b* (refer to FIG. 6) of the circuit board 5.

As illustrated in FIGS. 3 and 6, the bus bar block 11 is an assembly of a plurality of bus bars formed by integrally combining together a fuse bus bar 14 that connects the fuses 20 and the circuit board 5 and an FL bus bar 15 that connects the fusible links 21 and the circuit board 5. As illustrated in FIGS. 3 and 4, the bus bar block 11 includes a block body (a holding member) 13, the fuse bus bar 14, and the FL bus bar 15.

The block body 13 is formed of an insulating synthetic resin. The block body 13 is configured so that the fuse bus bar 14 and the FL bus bar 15 can be assembled thereto. By assembling the fuse bus bar 14 and the FL bus bar 15 to the block body 13, the bus bar block 11 is configured in which the fuse bus bar 14 and the FL bus bar 15 are integrally combined. As illustrated in FIG. 4, the block body 13 is sectioned into two parts in the depth direction and includes a fuse bus bar installing part 13*a* for installing the fuse bus bar 14 on the front face side in the depth direction and an FL bus bar installing part 13*b* for installing the FL bus bar 15 on the rear face side in the depth direction. The lower end on the lower side in the stacking direction of the block body 13 is brought into contact with the front face 5*a* of the circuit board 5, and the bus bars assembled to the block body 13 are connected to the circuit board 5, thereby causing the bus bar block 11 to be connected to the circuit board 5.

The bus bar block 11 is in direct contact with the circuit board 5 and is likely to deform under the influence of heat of solder. For this reason, it is desirable that the block body 13 be formed of a synthetic resin with high heat resistance. A material of the block body 13 can be syndiotactic polystyrene (SPS) that is generally used as an engineering plastic, for example.

Similarly, it is also desirable that the fuse holder 6 that is fit to the bus bar block 11 to be connected to the circuit board 5 be formed of a material with high heat resistance, and the fuse holder 6 can be formed using a Zylon material, for example. The fuse holder 6 is configured so that it is fit to the bus bar block 11 and can thereby prevent the fuse bus bar 14 assembled to the block body 13 from rattling. With this configuration, an exclusive member for preventing the fuse bus bar 14 from rattling is not required to be installed in between the fuse holder 6 and the bus bar block 11, and a reduction in parts count, a reduction in assembly man-hour, and a weight reduction are made possible. In addition, the amount of usage of an expensive heat-resistant resin can be reduced, and a reduction in environmental loads and a cost reduction are made possible.

The fuse bus bar 14 is formed by disposing multi-layered bus bars in a stacking manner in the stacking direction. In the present embodiment, as illustrated in FIG. 3, the fuse bus bar 14 includes four-layered bus bars, including, in order from the lower side in the stacking direction, a first-layer bus bar 14*a* (a third bus bar), a second-layer bus bar 14*b* (a fourth bus bar), a third-layer bus bar 14*c* (the third bus bar), and a fourth-layer bus bar 14*d* (the fourth bus bar). The first-layer bus bar 14*a*, the second-layer bus bar 14*b*, the third-layer bus bar 14*c*, and the fourth-layer bus bar 14*d* are separately incorporated into the fuse bus bar installing part 13*a* of the block body 13 to be held while being insulated from each other.

As illustrated in FIG. 6, the first-layer bus bar 14*a*, the second-layer bus bar 14*b*, the third-layer bus bar 14*c*, and the fourth-layer bus bar 14*d* are bent in a substantially L shape when viewed in the width direction. A one side part from a bent part extends to the front face side in the depth direction, and another side part extends to the lower side in the stacking direction. The respective one side parts of the bus bars 14*a* to 14*d* protrude toward the fuse holder 6 side from the block body 13. The respective other side parts of the bus bars 14*a* to 14*d* are inserted into the fuse bus bar installing part 13*a* of the block body 13 from the upper side in the stacking direction and protrude toward the circuit board 5 side.

As illustrated in FIGS. 3 and 4, each of the first-layer bus bar 14*a*, the second-layer bus bar 14*b*, the third-layer bus bar 14*c*, and the fourth-layer bus bar 14*d* has a plurality of (18 in the present embodiment) tuning-fork-shaped fuse connecting parts 14*e* on the end of the one side part in the width direction and has a plurality of pin-shaped circuit connecting parts 14*f* on the end of the other side part in the width direction. The fuse connecting parts 14*e* are inserted into the respective fuse accommodating parts 6*a* of the fuse holder 6 and can be connected to the fuses 20 fit to the fuse accommodating parts 6*a*. The circuit connecting parts 14*f* are inserted into through holes of the circuit board 5 and are connected to the printed circuit on the back face 5*b* of the circuit board 5 by solder jointing or the like.

The bus bars 14*a* to 14*d* of the fuse bus bar 14 are configured so that a bus bar disposed on a more upper side in the stacking direction is formed so as to have a larger total length in the depth direction and the stacking direction and so that the position of the circuit connecting part 14*f* connected to the circuit board 5 is disposed on a rearer side in the depth direction when being assembled to the block body 13. In other words, as illustrated in FIG. 6, the first-layer bus bar 14*a* disposed on the lowest side in the stacking direction has the shortest total length in the depth direction and the stacking direction, and the position of the circuit connecting part 14*f* connected to the circuit board 5 is disposed on the frontmost face side in the depth direction, and the fourth-layer bus bar 14*d* disposed on the uppermost side in the stacking direction has the longest total length in the depth direction and the stacking direction, and the position of the circuit connecting part 14*f* connected to the circuit board 5 is disposed on the most rear face side in the depth direction. With this configuration, as illustrated in FIGS. 3 through 6, protruding amounts in the depth direction of the respective fuse connecting parts 14*e* of the bus bars 14*a* to 14*d* of the respective layers from the block body 13 are aligned with each other.

The first-layer bus bar 14a and the second-layer bus bar 14b on the lower side in the stacking direction are configured so that the fuse connecting part 14e of the first-layer bus bar 14a and the fuse connecting part 14e of the second-layer bus bar 14b, the positions in the width direction of which are the same, are together inserted into one of the fuse accommodating parts 6a on the row on the lower side in the stacking direction of the fuse holder 6. The third-layer bus bar 14c and the fourth-layer bus bar 14d on the upper side in the stacking direction are configured so that the fuse connecting part 14e of the third-layer bus bar 14c and the fuse connecting part 14e of the fourth-layer bus bar 14d, the positions in the width direction of which are the same, are together inserted into one of the fuse accommodating parts 6a on the row on the upper side in the stacking direction of the fuse holder 6. One of the pair of fuse connecting parts 14e inserted into the same fuse accommodating part 6a is connected to one of an input terminal and an output terminal of the fuse 20 fit to the fuse accommodating part 6a, and the other of the pair of fuse connecting parts 14e is connected to the other of the input terminal and the output terminal of the fuse 20.

As illustrated in FIG. 3, the FL bus bar 15 includes a first bus bar 16 and a second bus bar 17, and as illustrated in FIG. 6, the first bus bar 16 is connected to one of an input terminal and an output terminal of the fusible link 21 fit to the FL accommodating part 10a of the FL holder 10, and the second bus bar 17 is connected to the other of the input terminal and the output terminal of the fusible link 21. In the present embodiment, four FL accommodating parts 10a are disposed, and as illustrated in FIGS. 4 and 5, four first bus bars 16-1, 16-1, 16-3, and 16-4 separately inserted into the respective FL accommodating parts 10a are disposed in the width direction, and similarly, four second bus bars 17-1, 17-2, 17-3, and 17-4 are disposed in the width direction. In other words, the FL bus bar 15 includes a plurality of pairs of the first bus bar 16 and the second bus bar 17 corresponding to the number of the FL accommodating parts 10a of the FL holder 10; the present embodiment includes four pairs thereof.

As illustrated in FIGS. 5 and 6, the first bus bar 16 is formed in a linear shape extending in the stacking direction and is erected in the vertical direction from the circuit board 5. The first bus bar 16 includes an FL connecting part 16a for connecting to the fusible link 21 on the end on the upper side in the stacking direction and a pin-shaped circuit connecting part 16b on the end on the lower side in the stacking direction. The first bus bar 16 is pressed in to a press-in hole 13c formed in the FL bus bar installing part 13b of the block body 13 from the upper side in the stacking direction, thereby causing the circuit connecting part 16b to protrude toward the circuit board 5 and to be held by the block body 13.

As illustrated in FIGS. 4 through 6, three second bus bars 17-1 to 17-3 among the second bus bars 17 are formed in a crank shape and include a first vertical part 17a erected in the vertical direction (toward the upper side in the stacking direction) from the circuit board 5, a horizontal part 17b that is bent from the first vertical part 17a and extends in a parallel direction with respect to the circuit board 5, and a second vertical part 17c that is bent from the horizontal part 17b and extends (erects) in the vertical direction. The second bus bar 17 has a pin-shaped circuit connecting part 17d on the end on the lower side in the stacking direction of the first vertical part 17a and has an FL connecting part 17e on the end on the upper side in the stacking direction of the second vertical part 17c. The horizontal part 17b extends in the depth direction. The first vertical part 17a is coupled to the end on the rear face side in the depth direction of the horizontal part 17b, and the second vertical part 17c is coupled to the end on the front face side in the depth direction of the horizontal part 17b. The circuit connecting part 17d of the first vertical part 17a is connected to the circuit board 5, and a boundary part between the horizontal part 17b and the second vertical part 17c is mounted on a mounting shelf 13d formed in the FL bus bar installing part 13b, thereby causing the second bus bars 17-1 to 17-3 that are to be installed on the circuit board 5 while being held by the block body 13. The second bus bars 17-1 to 17-3 pass by the upper side in the stacking direction terminals of connector blocks 8 and the relays 12 in parallel to the circuit board 5 by the horizontal part 17b protruding toward the rear face side in the depth direction from the mounting shelf 13d and are inserted into and connected to through holes 5c of the circuit board 5 using the space among the terminals and the relays 12.

As illustrated in FIG. 5, the mounting shelf 13d of the FL bus bar installing part 13b is formed by erecting a peripheral wall around its bottom face, and a notch with a width into which the horizontal part 17b of the second bus bar 17 can be inserted is formed at the part on the rear face side in the depth direction in the peripheral wall so as to extend to the bottom face and can thereby accommodate the part on the lower side in the stacking direction of the second vertical part 17c of the second bus bars 17-1 to 17-3. A pair of locking pieces 17f are formed in a part to be accommodated in the mounting shelf 13d in the second vertical part 17c of the second bus bars 17-1 to 17-3 on both sides in the width direction. When the second bus bars 17-1 to 17-3 are installed on the mounting shelves 13d, the locking pieces 17f are fit to an inner peripheral face of the peripheral wall of the mounting shelves 13d, thereby preventing the second bus bars 17-1 to 17-3 from moving toward the front face side and the rear face side in the depth direction with respect to the block body 13. When the second bus bars 17-1 to 17-3 are installed on the mounting shelves 13d, the horizontal parts 17b are brought into contact with the bottom face of the mounting shelves 13d, thereby preventing the second bus bars 17-1 to 17-3 from moving toward the lower side in the stacking direction. Furthermore, as illustrated in FIG. 7, when the electrical connection box 1 is assembled, the second bus bars 17-1 to 17-3 cause the tips of the second vertical parts 17c to be inserted into the FL accommodating parts 10a from the lower side in the stacking direction, and the locking pieces 17f of the second vertical parts 17c are in contact with the wall of the inner cover 3 from the lower side in the stacking direction. With this configuration, the second bus bars 17-1 to 17-3 are prevented from floating to the upper side in the stacking direction.

When the second bus bars 17-1 to 17-3 are assembled to the block body 13 as described above, the second bus bars 17-1 to 17-3 are fit to the respective mounting shelves 13d, and positioning of the second bus bars 17-1 to 17-3 with respect to the block body 13 can easily be performed.

The one residual second bus bar 17-4 among the bus bars 17 is formed in a shape similar to that of the first bus bar 16 unlike the others, is pressed in to the press-in hole 13c of the FL bus bar installing part 13b from the upper side in the stacking direction, thereby causing the circuit connecting part 17d to protrude toward the circuit board 5 side and to be held by the block body 13. The second bus bar 17-4 is disposed in parallel to the first bus bar 16-4 and is installed so that the FL connecting part 17e is positioned at a height position in the stacking direction substantially the same as that of the FL connecting part 16a of the first bus bar 16-4.

The first bus bar 16 and the second bus bar 17 are configured so that the respective FL connecting parts 16a of the first bus bars 16-1, 16-2, 16-3, and 16-4 and the respective FL connecting parts 17e of the second bus bars 17-1, 17-2, 17-3, and 17-4, the respective positions in the width direction of which are the same, are together inserted into each one of the FL accommodating parts 10a of the FL holder 10. One of a pair of the FL connecting part 16a and the FL connecting part 17e inserted into the same FL accommodating part 10a is connected to one of the input terminal and the output terminal of the fusible link 21 fit to the FL accommodating part 10a, and the other of the pair of the FL connecting part 16a and the FL connecting part 17e is connected to the other of the input terminal and the output terminal of the fusible link 21.

As described above, the first bus bar 16 is pressed in to the press-in hole 13c formed in the FL bus bar installing part 13b of the block body 13 to be held by the block body 13. The second bus bar 17 is mounted on the mounting shelf 13d formed in the FL bus bar installing part 13b of the block body 13 to be held by the block body 13. In other words, both the first bus bar 16 and the second bus bar 17 constituting the FL bus bar 15 are held by the block body 13.

With this configuration of the FL bus bar 15, the FL accommodating parts 10a on which the fusible links 21 are mounted in the electrical connection box 1 are disposed immediately above in the stacking direction a location in which the first bus bar 16 and the second bus bar 17 of the FL bus bar 15 are held by the FL bus bar installing part 13b. The following considers a case in which the fusible links 21 are fit to the FL accommodating parts 10a in this configuration of the present embodiment.

In this case, as illustrated in FIG. 6, an inserting force F directed to the lower side in the stacking direction is applied. The inserting force F is transmitted to the first bus bar 16 and the second bus bar 17 of the FL bus bar 15 via the FL connecting parts 16a and the FL connecting parts 17e to be connected to the fusible links 21. In this situation, the first bus bar 16 is pressed in to the press-in hole 13c of the FL bus bar installing part 13b to be held by the block body 13 and can receive the inserting force F toward the lower side in the stacking direction by an inner peripheral face of the press-in hole 13c. With this configuration, the first bus bar 16 generates a reaction force f1 against the inserting force F toward the upper side in the stacking direction. In this situation, the second bus bar 17 is mounted on the mounting shelf 13d of the FL bus bar installing part 13b, and the bottom face of the mounting shelf 13d can receive the inserting force F toward the lower side in the stacking direction. With this configuration, the second bus bar 17 generates a reaction force f2 against the inserting force F toward the upper side in the stacking direction.

As described above, in the present embodiment, when the fusible links 21 are fit to the FL accommodating parts 10a, the first bus bar 16 and the second bus bar 17 of the FL bus bar 15 generate the reaction force f1 and the reaction force f2, respectively, against the applied inserting force F, and the fit between the fusible links 21 and the FL connecting parts 16a of the first bus bar 16 and the FL connecting parts 17e of the second bus bar 17 can be facilitated, thus causing the fusible links 21 to be easily fit to the FL accommodating parts 10a. Both the first bus bar 16 and the second bus bar 17 of the FL bus bar 15 are held by the block body 13, and the inserting force F is received by the block body 13 and is prevented from being transmitted to connecting parts between the first bus bar 16 and the second bus bar 17 and the circuit board 5, and the quality of the connecting parts (solder joints, for example) can be ensured. The mounting shelf 13d of the FL bus bar installing part 13b can receive the inserting force F transmitted to the second bus bar 17, and the influence of the inserting force F can be prevented from being transmitted to the horizontal part 17b of the second bus bar 17, thereby favorably preventing the horizontal part 17b of the second bus bar 17 from bending when the fusible links 21 are fit to the FL accommodating parts 10a.

Figure 8:
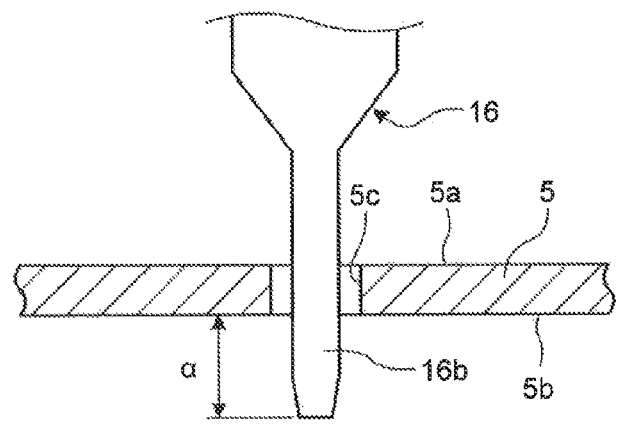
FIG. 8 is a schematic diagram illustrating a terminal shape of a circuit connecting part of a first bus bar according to the present embodiment as an example of a terminal shape of a conventional bus bar in a connecting part with the circuit board.
Figure 9:
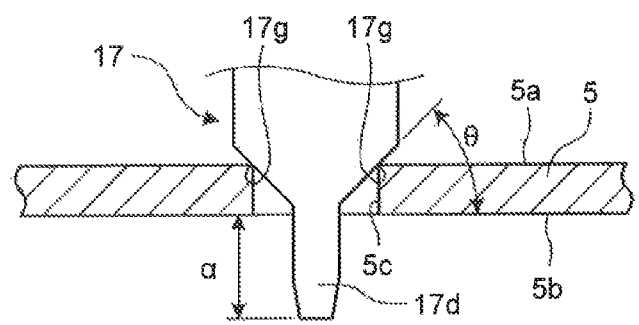
FIG. 9 is a schematic diagram illustrating a terminal shape of a circuit connecting part of a second bus bar in a connecting part with the circuit board.

The following next describes a terminal shape of the circuit connecting part 17d of the second bus bar 17 with reference to FIGS. 8 and 9. FIG. 8 is a schematic diagram illustrating a terminal shape of a circuit connecting part of a first bus bar according to the present embodiment as an example of a terminal shape of a conventional bus bar in a connecting part with the circuit board. FIG. 9 is a schematic diagram illustrating a terminal shape of a circuit connecting part of a second bus bar in a connecting part with the circuit board.

As illustrated in FIG. 8, the circuit connecting part 16b of the first bus bar 16 as the conventional terminal shape is generally inserted into the through hole 5c and is connected by soldering. In this situation, in order to avoid degradation in connection reliability caused by faulty soldering in soldering, it is describable that a protruding margin α from the circuit board 5 be a certain value. The protruding margin α can be represented as a protruding amount of the circuit connecting part 16b inserted into the through hole 5c of the circuit board 5. The protruding margin α largely varies depending on the influence of dimension accuracy or processing accuracy of the terminal (the first bus bar 16), and a fixed position of the first bus bar 16 and the terminal shape of the circuit connecting part 16b are required to be thoroughly managed.

In contrast, as illustrated in FIG. 9, the circuit connecting part 17d of the second bus bar 17 in the present embodiment is configured so that a taper-shaped contact part 17g as a transition part from the second bus bar 17 to the pin-shaped circuit connecting part 17d is brought into contact with the through hole 5c of the circuit board 5. The contact part 17g of the second bus bar 17 can easily be brought into contact with the circuit board 5 through the own weight of the second bus bar 17 itself. With this configuration, unlike the conventional example, the requirement to thoroughly manage the fixed position of the second bus bar 17 and the terminal shape of the circuit connecting part 17d in order to set the protruding margin α to the certain value is eliminated, and manufacturing lead time and equipment operation can be reduced. Consequently, manufacturing costs can be reduced, and consideration to the environment can be performed.

It is desirable that a contact angle θ (an inclination angle of the tapered shape of the contact part 17g based on the back face 5b of the circuit board 5) of the contact part 17g be 45 degrees or more. With this value, an edge of the through hole 5c with which the contact part 17g is brought into contact can be made resistant to be crushed, and the possibility of abrading a surface resist of the circuit board 5 can be reduced. In addition, formation of a solder fillet can be facilitated.

Although the embodiment exemplifies the circuit connecting part 17d of the second bus bar 17 as a component that is brought into contact with the through hole 5c of the circuit board 5 via the contact part 17g, the terminal shape of the circuit connecting part 16b of the first bus bar 16 or the circuit connecting parts 14f of the fuse bus bar 14 of the embodiment may be formed similarly. On the contrary to this, the terminal shape of the circuit connecting part 17d of the second bus bar 17 may be the conventional terminal shape illustrated in FIG. 8.

The following next describes effects of the electrical connection box 1 according to the present embodiment.

The electrical connection box 1 of the present embodiment includes: the casing 2; the circuit board 5 accommodated inside the casing 2; the FL accommodating parts 10a that are disposed on the outer face (the main face wall 3a) of the casing 2 that faces the front face 5a of the circuit board 5 and to which the fusible links 21 are fit; the first bus bars 16 that are erected in the vertical direction from the circuit board 5 and connect the fusible links 21 fit to the FL accommodating parts 10a and the circuit board 5; the second bus bars 17 each of which includes the first vertical part 17a erected in the vertical direction from the circuit board 5, the horizontal part 17b that is bent from the first vertical part 17a and extends in a parallel direction with respect to the circuit board 5, and the second vertical part 17c that is bent from the horizontal part 17b and extends in the vertical direction and that connect the fusible links 21 fit to the FL accommodating parts 10a and the circuit board 5; and the block body 13 of the bus bar block 11 that is disposed on the circuit board 5 and holds the first bus bars 16 and the second bus bars 17.

With this configuration, when the fusible links 21 are fit to the FL accommodating parts 10a, the block body 13 of the bus bar block 11 can receive the pressing force (that is, the inserting force F) transmitted to the first bus bars 16 and the second bus bars 17 that are to be connected to the fusible links 21, and flexural deformation of the first bus bars 16 and the second bus bars 17 caused by the pressing force can be reduced. Consequently, when the fusible links 21 are fit, deformation of the first bus bars 16 and the second bus bars 17 that are to be connected to the fusible links 21 can favorably be reduced. By holding both the first bus bars 16 and the second bus bars 17 that are to be connected to the fusible links 21 by the block body 13 of the bus bar block 11, the block body 13 can be functioned as a stress receiving part when the fusible links 21 are fit, and positioning when the first bus bars 16 and the second bus bars 17 are assembled can be made easy.

In the electrical connection box 1 of the present embodiment, the block body 13 holds the first bus bars 16 pressed in thereto. The block body 13 receives the inserting force F applied to the horizontal parts 17b of the second bus bars 17 when the fusible links 21 are inserted into the FL accommodating parts 10a by the mounting shelves 13d from the circuit board 5 side to hold the second bus bars 17.

With this configuration, when the fusible links 21 are inserted into the FL accommodating parts 10a, the block body 13 of the bus bar block 11 can receive the inserting force F transmitted to the first bus bars 16 and the second bus bars 17 that are to be connected to the fusible links 21 more surely, and the deformation of the first bus bars 16 and the second bus bars 17 can further be reduced.

The electrical connection box 1 of the present embodiment includes the fuse accommodating parts 6a that are disposed on the side wall 2a of the casing 2 disposed orthogonally to the circuit board 5 and to which the fuses 20 are fit, the first-layer bus bar 14a, the second-layer bus bar 14b, the third-layer bus bar 14c, and the fourth-layer bus bar 14d of the fuse bus bar 14 that connects the fuses 20 fit to the fuse accommodating parts 6a and the circuit board 5. The block body 13 of the bus bar block 11 holds the first-layer bus bar 14a, the second-layer bus bar 14b, the third-layer bus bar 14c, and the fourth-layer bus bar 14d.

With this configuration, the FL accommodating parts 10a are disposed at positions facing the circuit board 5 against the fuse accommodating parts 6a to dispose the electronic components connected to the bus bar block 11 in a plurality of rows, and thus the number of electronic components that can be connected to the circuit board 5 via the bus bar block 11 can be increased. In addition, flexibility in routing of the bus bars 14 and 15 of the bus bar block 11 can be increased.

Although the embodiment exemplifies a configuration in which the fusible links 21 are fit to the FL accommodating parts 10a disposed in the vertical direction from the circuit board 5, electronic components other than the fusible links 21 may be used. Although a configuration is exemplified in which the fuse accommodating parts 6a are disposed on the side wall 2a (a side face) of the casing 2 to which the fuses 20 are fit, electronic components other than the fuses 20 may be used.

When the electronic components are fit to the electronic component accommodating parts, the electrical connection box according to the present invention can receive a pressing force transmitted to the first bus bars and the second bus bars that are to be connected to the electronic components by the holding member, can thereby reduce flexural deformation of the first bus bars and the second bus bars through the pressing force, and consequently, produces an effect of, when the electronic components are fit, favorably preventing deformation of the bus bars to be connected to the electronic components.

The connector according to the present invention suppresses the relative displacement of the male terminal to the male terminal accommodating chamber in the male connector or suppresses the relative displacement of the female terminal to the female terminal accommodating chamber in the female connector. This can suppress a relative displacement between the male and female terminals, thereby improving contact stability of a contact point between the male and female terminals.

What is claimed is:
1. An electrical connection box comprising:
a casing;
a circuit board accommodated within the casing;
electronic component accommodating parts that are disposed on an outer face of the casing that faces a front side of the circuit board and to which electronic components are fit;
first bus bars that are erected in a vertical direction from the circuit board and configured to connect the electronic components fit to the electronic component accommodating parts and the circuit board;
second bus bars each of which includes a first vertical part erected in the vertical direction from the circuit board, a horizontal part that is bent from the first vertical part and extends in a parallel direction with respect to the circuit board, and a second vertical part that is bent from the horizontal part and extends in the vertical direction, and that connect the electronic components fit to the electronic component accommodating parts and the circuit board; and
a holding member that is disposed on the circuit board, has a press-in hole and is configured to hold the first bus bars and the second bus bars, wherein
the first bus bars are pressed into the press-in hole, and when the electronic components are fit to the electronic component accommodating parts, the first bus bars receive an inserting force applied to the first bus bars by an inner peripheral face of the press-in hole.

2. The electrical connection box according to claim 1, wherein
the holding member receives an inserting force applied to the horizontal parts of the second bus bars when the electronic components are inserted into the electronic component accommodating parts from the circuit board side to hold the second bus bars.

3. The electrical connection box according to claim 1, further comprising:
second electronic component accommodating parts that are disposed on a side face of the casing disposed orthogonally to the circuit board and to which second electronic components are fit; and
third bus bars and fourth bus bars that connect the second electronic components fit to the second electronic component accommodating parts and the circuit board, wherein
the holding member holds the third bus bars and the fourth bus bars.

4. The electrical connection box according to claim 2, further comprising:
second electronic component accommodating parts that are disposed on a side face of the casing disposed orthogonally to the circuit board and to which second electronic components are fit; and
third bus bars and fourth bus bars that connect the second electronic components fit to the second electronic component accommodating parts and the circuit board, wherein
the holding member holds the third bus bars and the fourth bus bars.

5. The electrical connection box according to claim 1, wherein
the electronic components are fit to the electronic component accommodating parts in the vertical direction.

* * * * *